United States Patent [19]

Werrbach

[11] Patent Number: 5,450,034

[45] Date of Patent: Sep. 12, 1995

[54] REFLECTED PLATE AMPLIFIER

[75] Inventor: Donn Werrbach, Glendale, Calif.

[73] Assignee: Aphex Systems, Ltd., Sun Valley, Calif.

[21] Appl. No.: 276,610

[22] Filed: Jul. 28, 1994

[51] Int. Cl.⁶ .............................................. H03F 5/00
[52] U.S. Cl. ........................................ 330/3; 330/288
[58] Field of Search ........................... 330/3, 288, 300

[56] References Cited

U.S. PATENT DOCUMENTS 5,017,884 5/1991 Perandi .................................. 330/3

Primary Examiner—Steven Mottola
Attorney, Agent, or Firm—Thomas I. Rozsa; Tony D. Chen

[57] ABSTRACT

A reflected plate amplifier (RPA) for use with electronic audio equipment. The RPA comprises an input circuit for receiving an input signal, a vacuum tube, a plate current reflector, and an output circuit for delivering an output signal. The vacuum tube has a control grid coupled to the input circuit for receiving the input signal, and a plate for delivering a plate current responsive to the input signal. The plate current reflector is a transistor having an input terminal coupled to the plate of the vacuum tube for receiving the plate current, and an output terminal for delivering a reflected current which is responsive to the plate current of the vacuum tube and therefore responsive to the input signal, while the plate current reflector holds the plate voltage of the vacuum tube substantially constant for a wide range of the plate current of the vacuum tube.

35 Claims, 2 Drawing Sheets

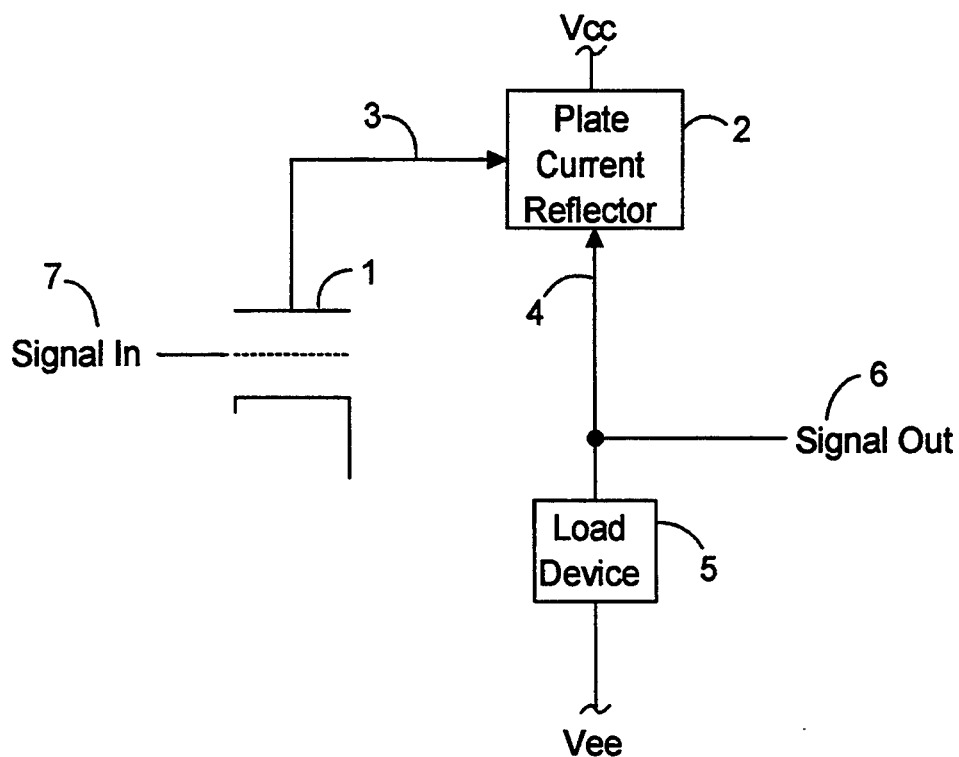
Figure 1
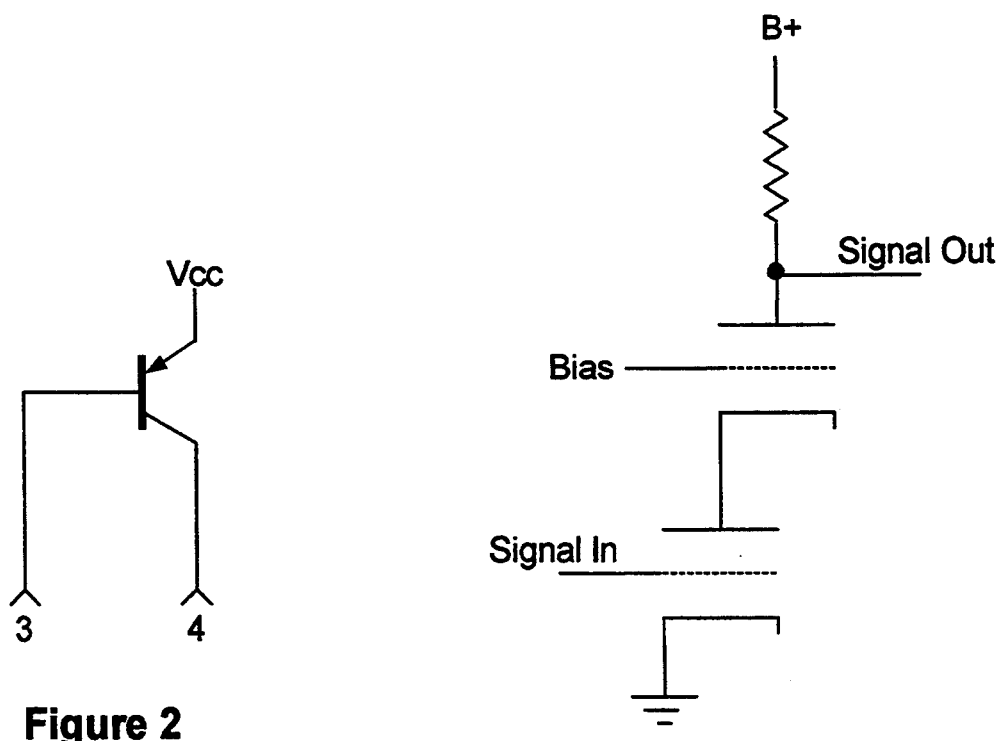
Figure 2
Figure 3
(Prior Art)

REFLECTED PLATE AMPLIFIER

BACKGROUND OF THE INVENTION

1. Field of the Invention

The present invention relates to the field of electronic amplifiers. More particularly the present invention relates to the use of vacuum tube circuits to provide amplification of electronic signals.

2. Description of The Prior Art

Vacuum tubes (hereinafter called "tubes") are considered obsolete except in some specialized fields such as radio frequency transmission where power amplifier tubes have not been completely replaced by transistors. Transistors have almost completely replaced tubes for small signal amplification and signal processing. There still exists a public interest in tube-based audio equipment, however.

Tube based home entertainment audio systems are increasingly in demand. There exists a growing group of audio enthusiasts who believe tube audio equipment sounds more lifelike or musical than equivalent transistor equipment. Tube based professional audio products have recently come into greater demand in the wake of the digitalization of the audio media because of an increasing awareness of digital audio's unnatural distortion. Analog tube devices such as compressor/limiters and equalizers are being used to recreate nuances of sound lost to digital quantization and processing or to soften the "edge" of digital sound. The demand for tube based equipment now supports a growing list of manufacturers in what might be called a resurgence of tube technology in audio. It would therefore be desirable and useful to create a new and improved tube amplifier circuit.

Field effect transistors (FETs) have been tried as a substitute for tubes to improve the reliability and stability of amplifiers, with limited success. While FETS are similar to tubes in many ways, they do not duplicate the sound reproduction of a tube circuit. It would therefore be useful and desirable to combine the sophistication and reliability of transistor technology with true tube technology in such a way so as to create products which deliver the sound quality of tubes but have much greater reliability and stability.

A problem of conventional tube circuits is that they require a high supply voltage of several hundred volts. This makes it inconvenient to integrate tubes into a solid state circuit design.

It would be an improvement over prior art to find a way to efficiently use tubes at the much lower power supply voltages generally used by transistors, for example only and without limiting the present invention, 10 to 30 volts. It would also be an improvement over prior art to find a way to operate tubes at a relatively low level of plate power dissipation while still obtaining useful transconductance.

It would further be an improvement over prior art to devise a method to operate tubes in such a way that the input control grid retains its normal characteristics and influence upon the plate current, but to develop the output signal voltage at a relatively low output impedance. It would also be desirable, if possible, to reduce or eliminate the tube's miller capacitance.

SUMMARY OF THE INVENTION

The present invention is a "reflected plate amplifier", hereinafter called an "RPA". The term "reflected plate amplifier" is proposed to name the unique circuit topology of the present invention in which the first plate current of a tube is "reflected" as a second dependent but parallel output current. The forthcoming description, taken together with the appended claims, will clearly show the novelty and usefulness of the present invention.

The primary object of the present invention is to provide an amplifier stage incorporating tube and transistor devices in a manner which retains sound reproducing characteristics of a tube amplifier, but operates efficiently at a greatly reduced plate power supply voltage.

It is also an object of the present invention to devise an amplifier stage incorporating tube and transistor devices which retains the nominal tube transconductance with relatively low plate power dissipation, and thereby operates with increased tube life.

It is another object of the present invention to create an amplifier stage incorporating tube and transistor devices which retains the conventional control grid characteristics of the tube itself.

It is a further object of the present invention to create an amplifier stage incorporating tube and transistor devices having an increased frequency bandwidth of gain by eliminating or reducing the miller effect.

It is an additional object of the present invention to create an amplifier stage incorporating tube and transistor devices which has a relatively low output impedance. It is also an object of the present invention to create an improved amplifier stage incorporating tube and transistor devices which is reliable, stable, and low in cost.

Described generally, the present invention is a reflected plate amplifier (RPA) for use with electronic audio equipment. The RPA comprises a vacuum tube having at least one grid, such as the control grid, for receiving an input signal, a plate for delivering a plate current responsive to said input signal, and a cathode. The RPA also comprises a plate current reflector having an input terminal coupled to the plate of the vacuum tube for receiving the plate current, and an output terminal for delivering a reflected current which is responsive to the plate current of the vacuum tube and therefore responsive to the input signal, while holding the plate voltage at a nearly constant and relatively low direct current (D.C.) potential at all times. The RPA further comprises a load circuit coupled to the output terminal of the plate current reflector for delivering an output signal which is responsive to the input signal.

Further novel features and other objects of the present invention will become apparent from the following detailed description, discussion and the appended claims, taken in conjunction with the drawings.

BRIEF DESCRIPTION OF THE DRAWINGS

Referring particularly to the drawings for the purpose of illustration only and not limitation, there is illustrated:

FIG. 1 is a block diagram of the present invention reflected plate amplifier (RPA).

FIG. 2 is an illustration of a simple current mirror.

FIG. 3 shows a prior art cascode tube amplifier.

DESCRIPTION OF THE PREFERRED EMBODIMENT

Figure 4:
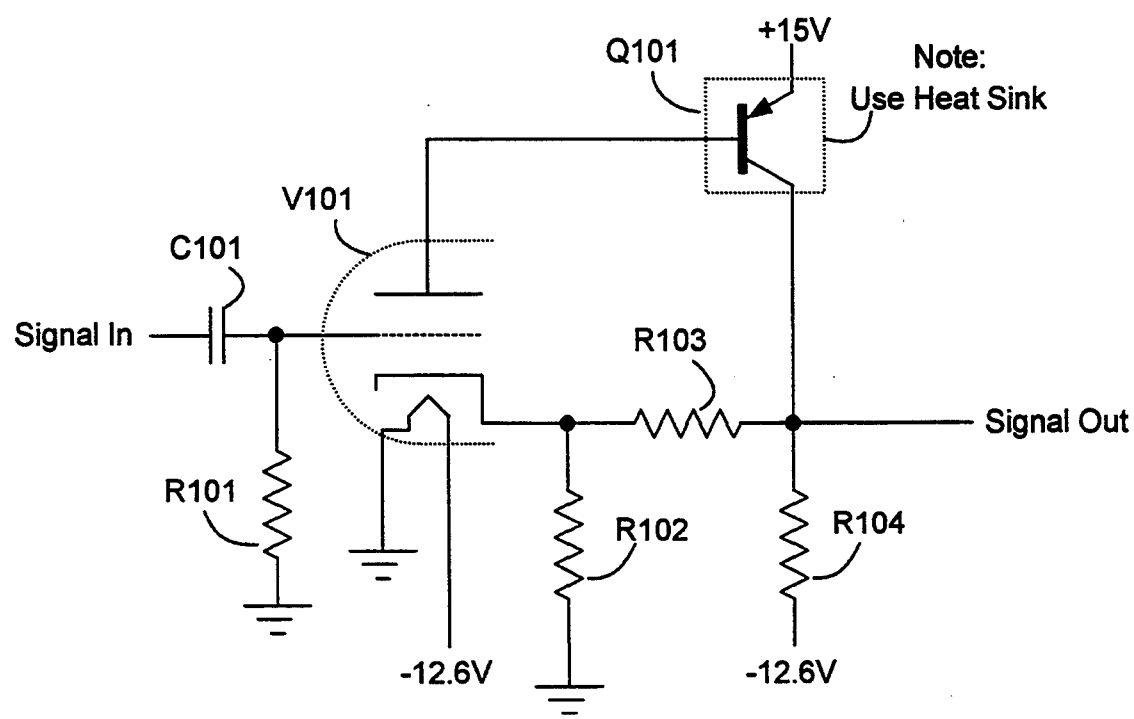
FIG. 4 shows one preferred embodiment of the present invention.

Although specific embodiments of the present invention will now be described with reference to the drawings, it should be understood that such embodiments are by way of example only and merely illustrative of but a small number of the many possible specific embodiments which can represent applications of the principles of the present invention. Various changes and modifications obvious to one skilled in the art to which the present invention pertains are deemed to be within the spirit, scope and contemplation of the present invention as further defined in the appended claims.

Referring to FIG. 1, the present invention is an amplifier circuit containing a tube 1 for producing a first plate current 3 which is responsive to the tube's control grid voltage input signal 7, a transistor plate current reflector 2 to reflect the tube's plate current 3 as a second current path 4 while holding the plate voltage at a nearly constant and relatively low D.C. potential at all times, and a load circuit 5 coupled within the second current path 4 to develop a voltage output signal 6 which is thereby responsive to the voltage input signal 7.

In FIG. 1, the input tube 1 is depicted as a triode for simplicity of illustration only, but can be any other tube configuration such as a tetrode, a pentode, etc. If a configuration other than triode is used, it is obvious that proper biasing of the additional grids must be provided but these details are not necessarily an aspect of the present invention.

It should also be obvious that a tube configuration other than a triode could be "triode connected" and still remain within the scope and contemplation of the present invention. The specific considerations for biasing a tube for linear operation is also outside the scope of the present invention, but conventional tube theory would normally apply. For the purposes of the present invention it will be assumed the tube is biased in some manner which causes the tube to operate in the desired portion of its operating range as suggested by conventional tube circuit practices.

Without limiting the present invention, and for example only, it has been found that cathode self bias and grid bias are both suitable methods to realize a practical embodiment of the present invention. Furthermore, it is within the scope and contemplation of the present invention that the tube of FIG. 1 could be a single tube such as depicted in the embodiment circuit of FIG. 3, or one half of a differential amplifier pair of tubes, or some other unspecified combination of tubes.

What is germane to the present invention is the reflection of the plate current of a tube into a reflected current, the subsequent conversion of the reflected current into a voltage output signal, the constant voltage plate operation of the tube, and other details associated with the aforementioned items. Any tube circuit capable of operating within the teachings of the present invention, i.e., having a means of producing a plate current responsive to an input signal, should be considered within the scope and contemplation of the present invention.

The plate current reflector of FIG. 1 can be described as a transistor circuit having a current input and an input dependent current output, both currents being referred to the positive power supply voltage Vcc to which the plate current reflector is connected. The said output current is a function of the input current, and may be in exact proportion to said input current, i.e., at a 1:1 current ratio or at other ratios of input to output current.

A common class of circuit known as "current mirrors" may be used as a plate current reflector. However, the adaptation of a solid state current mirror to reflect the plate current of a tube has not been seen by the present inventor in any prior art, and is therefore believed to be a concept not made obvious by the prior art. It is obvious that current mirrors can be used as constant-current sources and as such have been used as plate loads for tube amplifiers in which case the amplifier will typically achieve a higher gain than possible with resistance or impedance loading. However, this technique should not be confused with the present invention which uses current mirrors not as constant current plate loads.

By way of explanation only, and not to limit the present invention in any way, a current mirror circuit suitable to the present invention is shown in FIG. 2. Any other suitable current mirror circuit used as the plate current reflector 2 of FIG. 1 would be within the scope and contemplation of the present invention.

A feature of the current mirror of FIG. 2, and of most other current mirrors, is that the current input 3 exhibits a forward biased diode (or base-emitter) impedance relative to Vcc. The said diode impedance is relatively low compared to the plate load resistance of a conventional tube amplifier. Typical conventional plate load impedances are in the 100,000 to 1 megohm range, whereas the diode impedance may be only a few hundred ohms or less.

Thus, when the tube plate 1 is coupled to the current mirror input 3, the plate voltage will remain close to the Vcc potential and little if any signal voltage will develop on the plate even though there is a relatively large plate current swing responsive to an input signal. The significance of this is two fold. First, there is no miller effect since there is no plate voltage swing. Second, the plate can be operated near its lowest active potential at all times and still maintain a nominal characteristic of transconductance. The reflected current 4 is a current which is of the same sense or polarity as the plate current. That means both currents flow in the same direction, and when the plate current increases, so does the reflected current.

Referring again to FIG. 1, it can be seen that the present invention RPA operates the tube in the "constant voltage" mode, meaning the plate is held at a constant voltage. Although this might appear analogous to the bottom half of a cascode circuit, which is depicted in FIG. 3, the present invention differs from a cascode amplifier in several ways. First, the present invention divorces the tube's plate current from the amplifier's output voltage, whereas a cascode amplifier develops the output voltage directly from the bottom tube's plate current which merely passes through the top tube to the load resistance and the B+ power supply. Second, a cascode amplifier supplies a phase inversion to the output signal, whereas the present invention supplies no phase inversion. Third, a cascode amplifier requires a much higher plate supply voltage than does the present invention. Thus, the present invention is not a cascode circuit.

The reflected current 4 of FIG. 1 is converted into an output voltage by the load device 5. For illustration only and without limiting the present invention, the load device 5 can be a passive device such as a resistor or other impedance connected between the current mirror and a second voltage potential Vee. It is also within the contemplation and scope of the present invention that the load device 4 can be an active load such as a constant current source.

Referring to FIG. 4, there is illustrated one preferred embodiment of the present invention. The tube V101 correlates to tube 1 of FIG. 1. The transistor Q101 correlates to the plate current reflector 3 of FIG. 1. The resistor R104 correlates to the load device 5 of FIG. 1. The remaining component parts of the circuit of FIG. 4 comprise practical input, biasing, and feedback circuits needed to assure stable and centered operation of the RPA circuit and are not necessarily considered to be within the scope of the present invention.

The operation of the circuit of FIG. 4 is as follows. A conventional tube input circuit is comprised of C101 for D.C. blocking, and R101, the grid leak resistor. The control grid of V101 thus receives an alternating current (A.C.) coupled input signal in the conventional manner. Direct coupling of the input signal is also possible without violating the teachings of the present invention by eliminating the capacitor C101 and coupling the input signal directly to the grid. The cathode of V101 is connected to ground through resistor R102. The base of transistor Q101 is coupled to the plate of tube V101 for the purpose of receiving the plate current of V101 into its base and creating a reflected current at its collector. The emitter of Q101 is coupled to a source of positive 15 volts for the purpose of polarizing Q101 and V101. The base-emitter voltage of Q101 remains at a level typically between approximately 0.5 to 0.6 volts for any value of plate current from V101, thus holding the plate of V101 substantially constant and close to a level typically between approximately 14.4 to 14.6 volts at all times, as taught by the forgoing description of the present invention. The collector current of Q101 is responsive to the plate current of V101 and is thus responsive to the signal input to V101. The collector current of Q101 is thus equivalent to the reflected plate current 4 of FIG. 1. The load resistor V104 is connected between the collector of Q101 and a source of negative 12.6 volts. Resistor R104 therefore develops an output voltage equivalent to the output signal 6 of FIG. 1 resulting from the flow of current from the collector of Q101 and is equivalent to the load device 5 of FIG. 1.

Since the circuit of FIG. 4 is a simplified but practical working version of the present invention, there are some additional circuit elements required to support the tube biasing, set the operating points, etc., which are not strictly a specification of the present invention but which will be further described to clarify the explanation of the circuit.

By way of demonstration, and not to limit the present invention in any way, the values of components shown in FIG. 4 may be as follows: V101 is one half of a 12AT7 dual triode, C101 is 0.1μF, R101 is 100KΩ, R102 is 620Ω, R103 is 7.5KΩ, R104 is 620Ω 2 watts, and Q101 is a 2SD631 pnp power transistor with small heat sink.

The operation of the circuit of FIG. 4 may be described as follows. An input signal is applied to the control grid of tube V101 through capacitor C101. The control grid is biased to zero D.C. volts by the grid leak resistor R101. Cathode bias for the tube V101 is created by current flowing through R102 in the manner of a conventional self biased tube amplifier. The collector current of the tube V101 flows to the positive 15 volt source through the forward biased base-emitter junction of the PNP transistor Q101. The plate current of V101 is responsive to the input signal according to the tube's transconductance factor. The base current of Q101 is obviously equal to the plate current of V101. The collector current of Q101 is dependent on the base current, and will be many times greater than the base current due to the transistor current gain. The collector current flows through R104 and produces a voltage drop across R104 which is proportional to the collector current. The collector voltage is defined as the amplifier's output voltage. The output voltage at the collector of Q101 swings in-phase with the grid voltage of V101. This is because of the fact that the collector current increases in proportion to the plate current which increases in proportion to the grid voltage. As the collector current increases, so does the collector voltage because the collector current is a reflection of the plate current. This is in contrast with a conventional plate load circuit where the plate signal is in inverse phase with the grid signal. The output impedance of the circuit of FIG. 4 is mainly determined by the value the load resistor R104, which in this case is 620 Ω. This is a much lower output impedance than provided by conventional tube stages, thus meeting another objective of the present invention.

Negative feedback to the cathode of tube V101 is used to stabilize the operating point and gain of the RPA of FIG. 4. This is provided by coupling a portion of the output signal to the cathode through the branch of R103 and R102. Because of the negative feedback, the voltage gain of the RPA of FIG. 4 is calculated to a reasonable accuracy as R103 divided by R102. The D.C. operating point at the collector of Q101 is a function of the tube's threshold bias, the transistor's beta, and the feedback ratio. For example only, the desired collector operating point might be zero D.C. volts. The proper D.C. voltage bias at the cathode of V101 can be established by adjusting the value of R103 until the zero volt operating point was reached on the collector of Q101. The circuit values given by example for R102 and R103 reflect the experimental results of this adjustment for a specific tube and transistor which were used.

This points up a limitation of the embodiment circuit of FIG. 4 because it is obvious that the gain of the amplifier is dependent upon the D.C. bias requirements. It is anticipated that many improvements are possible to the embodiment circuit of FIG. 4 without violating the teachings of the present invention. For example, a D.C. biasing servo using opamps or other devices could be added to the FIG. 4 circuit to establish the output D.C. operating point independent of the feedback ratio.

Many improvements and modifications can be made to the circuit of FIG. 4 without violating the teachings of the present invention. For example only, and without limiting the present invention, some such improvements and modifications could be: a different current mirror to replace Q101; a constant current load to replace R104; fixed bias for V101; a differential tube input stage to replace the single ended stage of V101; modification or elimination of the feedback network; different power supply voltages; different tube types; separate A.C. and D.C. feedback circuits, etc.

Defined in detail, the present invention is a reflected plate amplifier for use with an electronic audio equipment, comprising: (a) an input circuit having a capacitor element for blocking direct current (D.C.) components of an input signal; (b) a vacuum tube having a control grid, a plate, and a cathode, the control grid coupled to the input circuit for receiving the input signal, and the plate delivering a plate current responsive to the input signal; (c) a transistor having a base, an emitter and a collector, the base coupled to the plate of the vacuum tube for receiving the plate current, and the emitter coupled to a positive D.C. voltage source for polarizing the transistor and the vacuum tube; (d) the transistor having a base-emitter voltage which remains substantially constant as said plate current of said vacuum tube, varying in response to said input signal, to hold the plate of the vacuum at a voltage close to the positive D.C. voltage source at all times; (e) the transistor further creating a reflected current at its the collector which is responsive to the plate current of the vacuum tube, and therefore responsive to the input signal; (f) a negative feedback circuit including a resistor element connected between the collector of the transistor and the cathode of the vacuum tube for stabilization; and (g) an output circuit having a load element connected between the collector of the transistor and a negative D.C. source for producing an output signal; (h) whereby the output signal is in phase of a grid voltage of the vacuum tube and is responsive to the input signal.

Defined broadly, the present invention is an electronic amplifier for use with electronic audio equipment, comprising: (a) an input circuit for receiving an input signal; (b) a vacuum tube having a control grid, a plate, and a cathode, the control grid coupled to the input circuit for receiving the input signal, and the plate delivering a plate current responsive to the input signal; (c) a plate current reflector having an input terminal and an output terminal, the input terminal coupled to the plate of the vacuum tube for receiving the plate current; (d) the plate current reflector delivering a reflected current at its said output terminal which is responsive to the plate current of the vacuum tube and therefore responsive to the input signal, while holding a plate voltage of the vacuum tube substantially constant as said plate current of said vacuum tube, varying in response to said input signal; and (e) an output circuit coupled to the output terminal of the plate current reflector for delivering an output signal which is responsive to the input signal.

Defined more broadly, the present invention is an apparatus for use with electronic audio equipment, comprising: (a) a vacuum tube having at least one grid for receiving an input signal, a plate for delivering a plate current responsive to the input signal, and a cathode; (b) a plate current reflector having an input terminal coupled to the plate of the vacuum tube for receiving the plate current, and an output terminal for delivering a reflected current which is responsive to the plate current of the vacuum tube and therefore responsive to the input signal; and (c) an output circuit coupled to the output terminal of the plate current reflector for delivering an output signal which is responsive to the input signal.

Of course the present invention is not intended to be restricted to any particular form or arrangement, or any specific embodiment disclosed herein, or any specific use, since the same may be modified in various particulars or relations without departing from the spirit or scope of the claimed invention hereinabove shown and described of which the apparatus shown is intended only for illustration and for disclosure of an operative embodiment and not to show all of the various forms or modification in which the present invention might be embodied or operated.

The present invention has been described in considerable detail in order to comply with the patent laws by providing full public disclosure of at least one of its forms. However, such detailed description is not intended in any way to limit the broad features or principles of the present invention, or the scope of patent monopoly to be granted.

What is claimed is:

1. A reflected plate amplifier for use with electronic audio equipment, comprising:
    a. an input circuit having a capacitor element for blocking direct current (D.C.) components of an input signal;
    b. a vacuum tube having a control grid, a plate, and a cathode, the control grid coupled to said input circuit for receiving said input signal, and the plate delivering a plate current responsive to said input signal;
    c. a transistor having a base, an emitter and a collector, the base coupled to said plate of said vacuum tube for receiving said plate current, and the emitter coupled to a positive D.C. voltage source for polarizing the transistor and said vacuum tube;
    d. said transistor having a base-emitter voltage which remains substantially constant as said plate current of said vacuum tube varies in response to said input signal, to hold said plate of said vacuum at a voltage close to said positive D.C. voltage source at all times;
    e. said transistor further creating a reflected current at its said collector which is responsive to said plate current of said vacuum tube, and therefore responsive to said input signal;
    f. a negative feedback circuit including a resistor element connected between said collector of said transistor and said cathode of said vacuum tube for stabilization; and
    g. an output circuit having a load element connected between said collector of said transistor and a negative D.C. source for producing an output signal;
    h. whereby said output signal is in-phase with the control grid voltage of said vacuum tube and is responsive to said input signal.

2. The apparatus as defined in claim 1 further comprising a grid leak resistor element connected between said control grid of said vacuum tube and ground.

3. The apparatus as defined in claim 1 further comprising a resistor element connected between said cathode of said vacuum tube and ground.

4. An electronic amplifier for use with electronic audio equipment, comprising:
    a. an input circuit for receiving an input signal;
    b. a vacuum tube having a control grid, a plate, and a cathode, the control grid coupled to said input circuit for receiving said input signal, and the plate delivering a plate current responsive to said input signal;
    c. a plate current reflector having an input terminal and an output terminal, the input terminal coupled to said plate of said vacuum tube for receiving said plate current;
    d. said plate current reflector delivering a reflected current at its said output terminal which is responsive to said plate current of said vacuum tube and therefore responsive to said input signal, while holding a plate voltage of said vacuum tube substantially constant as said plate current of said vacuum tube varies in response to said input signal;

e. an output circuit coupled to said output terminal of said plate current reflector for delivering an output signal which is responsive to said input signal; and f. a negative feedback circuit connected between said output terminal of said plate current reflector and said cathode of said vacuum tube for stabilization.

5. The apparatus as defined in claim 4 wherein said input circuit has a capacitor element for blocking direct current (D.C.) components of said input signal.

6. The apparatus as defined in claim 4 further comprising a grid leak resistor element connected between said control grid of said vacuum tube and ground.

7. The apparatus as defined in claim 4 wherein said plate current reflector is a transistor having a base which is said input terminal, an emitter, and a collector which is said output terminal.

8. The apparatus as defined in claim 7 wherein said emitter of said transistor is coupled to a positive D.C. voltage source for polarizing said transistor and said vacuum tube.

9. The apparatus as defined in claim 8 wherein said plate current reflector holds said plate of said vacuum at a voltage close to said positive D.C. voltage source at all times.

10. The apparatus as defined in claim 4 wherein said negative feedback circuit includes a resistor element.

11. The apparatus as defined in claim 4 further comprising a resistor element connected between said cathode of said vacuum tube and ground.

12. The apparatus as defined in claim 4 wherein said output circuit has a load element connected between said output terminal of said plate current reflector and a negative D.C. source.

13. An apparatus for use with electronic audio equipment, comprising:

a. a vacuum tube having at least one grid for receiving an input signal, a plate for delivering a plate current responsive to said input signal, and a cathode;

b. a plate current reflector having an input terminal coupled to said plate of said vacuum tube for receiving said plate current, and an output terminal for delivering a reflected current which is responsive to said plate current of said vacuum tube and therefore responsive to said input signal;

c. an output circuit coupled to said output terminal of said plate current reflector for delivering an output signal which is responsive to said input signal; and d. a negative feedback circuit connected between said output terminal of said plate current reflector and said cathode of said vacuum tube.

14. The apparatus as defined in claim 13 wherein said at least one grid of said vacuum tube is a control grid.

15. The apparatus as defined in claim 14 further comprising an input circuit coupled to said control grid of said vacuum tube for blocking direct current (D.C.) components of said input signal.

16. The apparatus as defined in claim 14 further comprising a grid leak resistor element connected between said control grid of said vacuum tube and ground.

17. The apparatus as defined in claim 13 further comprising a resistor element connected between said cathode of said vacuum tube and ground.

18. An electronic amplifier for use with electronic audio equipment, comprising:

a. an input circuit for receiving an input signal;

b. a vacuum tube having a control grid, a plate, and a cathode, the control grid coupled to said input circuit for receiving said input signal, and the plate delivering a plate current responsive to said input signal;

c. a plate current reflector having an input terminal and an output terminal, the input terminal coupled to said plate of said vacuum tube for receiving said plate current;

d. said plate current reflector delivering a reflected current at its said output terminal which is responsive to said plate current of said vacuum tube and therefore responsive to said input signal, while holding a plate voltage of said vacuum tube substantially constant as said plate current of said vacuum tube varies in response to said input signal; and e. an output circuit coupled to said output terminal of said plate current reflector for delivering an output signal which is responsive to said input signal.

19. The apparatus as defined in claim 18 wherein said output signal is a low impedance output signal.

20. The apparatus as defined in claim 18 wherein said output signal is responsive to said input signal without a phase inversion.

21. The apparatus as defined in claim 18 wherein said input circuit has a capacitor element for blocking direct current (D.C.) components of said input signal.

22. The apparatus as defined in claim 18 further comprising a grid leak resistor element connected between said control grid of said vacuum tube and ground.

23. The apparatus as defined in claim 18 wherein said plate current reflector is a transistor having a base which is said input terminal, an emitter, and a collector which is said output terminal.

24. The apparatus as defined in claim 23 wherein said emitter of said transistor is coupled to a positive D.C. voltage source for polarizing said transistor and said vacuum tube.

25. The apparatus as defined in claim 24 wherein said plate current reflector holds said plate of said vacuum at a voltage close to said positive D.C. voltage source at all times.

26. The apparatus as defined in claim 18 further comprising a negative feedback circuit connected between said output terminal of said plate current reflector and said cathode of said vacuum tube for stabilization.

27. The apparatus as defined in claim 26 wherein said negative feedback circuit includes a resistor element.

28. The apparatus as defined in claim 18 further comprising a resistor element connected between said cathode of said vacuum tube and ground.

29. The apparatus as defined in claim 18 wherein said output circuit has a load element connected between said output terminal of said plate current reflector and a negative D.C. source.

30. An apparatus for use with electronic audio equipment, comprising:

a. a vacuum tube having at least one grid for receiving an input signal, a plate for delivering a plate current responsive to said input signal, and a cathode, wherein said at least one grid of said vacuum tube is a control grid;

b. an input circuit coupled to said control grid of said vacuum tube for blocking direct current (D.C.) components of said input signal;

c. a plate current reflector having an input terminal coupled to said plate of said vacuum tube for receiving said plate current, and an output terminal for delivering a reflected current which is responsive to said plate current of said vacuum tube and therefore responsive to said input signal; and d. an output circuit coupled to said output terminal of said plate current reflector for delivering an output signal which is responsive to said input signal.

31. The apparatus as defined in claim 30 wherein said output signal is a low impedance output signal.

32. The apparatus as defined in claim 30 wherein said output signal is responsive to said input signal without a phase inversion.

33. The apparatus as defined in claim 30 further comprising a grid leak resistor element connected between said control grid of said vacuum tube and ground.

34. The apparatus as defined in claim 30 further comprising a negative feedback circuit connected between said output terminal of said plate current reflector and said cathode of said vacuum tube.

35. The apparatus as defined in claim 30 further comprising a resistor element connected between said cathode of said vacuum tube and ground.

* * * * *